United States Patent
Peana et al.

(10) Patent No.: US 10,671,227 B2
(45) Date of Patent: Jun. 2, 2020

(54) INFORMATION HANDLING SYSTEM NARROW BEZEL TOUCHSCREEN DISPLAY TOUCH DETECTION GRID

(71) Applicant: Dell Products L.P., Round Rock, TX (US)

(72) Inventors: Stefan Peana, Austin, TX (US); Laurent Andrew Regimbal, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/101,724

(22) Filed: Aug. 13, 2018

(65) Prior Publication Data

US 2020/0050302 A1   Feb. 13, 2020

(51) Int. Cl.
| | |
|---|---|
| *G06F 3/044* | (2006.01) |
| *G06F 3/047* | (2006.01) |
| *G06F 3/041* | (2006.01) |
| *H03K 17/96* | (2006.01) |

(52) U.S. Cl.
CPC .............. *G06F 3/044* (2013.01); *G06F 3/047* (2013.01); *G06F 3/0412* (2013.01); *H03K 17/962* (2013.01); *G06F 2203/04107* (2013.01)

(58) Field of Classification Search
None
See application file for complete search history.

(56) References Cited

U.S. PATENT DOCUMENTS

| | | | |
|---|---|---|---|
| 8,754,662 B1 | 6/2014 | Weng et al. | |
| 9,075,484 B2 | 7/2015 | Ritter et al. | |
| 9,110,528 B2 | 8/2015 | Yeh et al. | |
| 9,164,306 B2 | 10/2015 | Lee | |
| 9,250,753 B2 | 2/2016 | Westhues et al. | |
| 9,678,602 B2 | 6/2017 | Wallander | |
| 2013/0234973 A1* | 9/2013 | Kim | G06F 3/044 345/173 |
| 2014/0253459 A1* | 9/2014 | Koo | G06F 3/0416 345/173 |
| 2014/0317392 A1* | 10/2014 | Kawano | G06F 9/4406 713/2 |
| 2016/0274703 A1 | 9/2016 | Satou | |
| 2018/0061343 A1* | 3/2018 | Kim | G09G 3/364 |
| 2018/0356917 A1* | 12/2018 | Lee | G06F 3/044 |

FOREIGN PATENT DOCUMENTS

WO   2015046769 A1   2/2015

* cited by examiner

*Primary Examiner* — Christopher J Kohlman
(74) *Attorney, Agent, or Firm* — Zagorin Cave LLP; Robert W. Holland

(57) ABSTRACT

A portable information handling system display provides a narrow bezel footprint with a diagonally disposed touch grid that passes touch detection conductive traces from opposing parallel sides of a rectangular protective cover. In one embodiment, the protective cover at the opposing parallel sides folds to the rear of the display to interface the touch grid to one or more cables and a touch controller.

17 Claims, 4 Drawing Sheets

INFORMATION HANDLING SYSTEM NARROW BEZEL TOUCHSCREEN DISPLAY TOUCH DETECTION GRID

BACKGROUND OF THE INVENTION

Field of the Invention

The present invention relates in general to the field of information handling system touch input devices, and more particularly to an information handling system narrow bezel touchscreen display touch detection grid.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems generally present information to end users as visual images. Portable information handling systems typically integrate a flat panel display into a housing to present visual images to end users when mobile. Integrated flat panel displays include liquid crystal displays (LCDs) and organic light emitting diode (OLED) display. Flat panel displays provide integrated support for presentation of visual images with minimal thickness and power consumption. End users tend to prefer portable information handling systems that have a minimal footprint and weight, thus providing improved mobility. In some instances, portable information handling systems integrate a keyboard that accepts keyed inputs, such as convertible or clamshell configurations having rotationally couple housing portions. Other portable information handling systems that do not integrate a keyboard tend to rely upon a touchscreen display to accept end user inputs, such as tablet information handling systems. The touchscreen display presents a user interface that indicates input values made by touches at depicted visual images. For instance, a display presents a keyboard that an end user touches to make keyed inputs.

Generally, information handling system touchscreen displays rely upon capacitive touch detection to detect inputs. Several types of capacitive touch detection are available although all generally apply capacitive coupling at an electric field to measure any conductive body. Generally, portable information handling systems use projected capacitance that allow detection of multiple touches and proximity sensing through an X-Y grid of conductive material that detects touches at gird intersections to determine a touch location. For instance, a glass cover over top of a display has a grid of thin wires etched into it and placed over the display so that the wire grid positions are known relative to the display. Capacitance is generally measured indirectly through its effects on or level of coupling or attenuation of an alternating current (AC) signal generated by an oscillator. Said otherwise, the touch detection grid has a set of aligned antennae that each detect near field effect.

One way to minimize a portable information handling system footprint is to reduce the bezel constructed around the integrated touch screen. Generally, the size of a portable information handling system is driven by the size of the integrated display that an end user selects. Some additional housing structure is typically placed around the display to protect it and hold it in place. A typical display bezel is 2.85 mm or greater extending outward from the display perimeter. Conventional touchscreen displays route X-Y grid wires that extend out of a display to the bezel area and then to a touch controller that scans the touchscreen grid intersection capacitance to isolate touch locations. OLED displays have provided an opportunity to further shrink information handling system dimensions by using direct illumination instead of the backlight illumination used by LCDs. Newer portable information handling system designs have sought to further reduce the display bezel size to 1.5 mm or less around the display edges.

SUMMARY OF THE INVENTION

Therefore, a need has arisen for a system and method which manages communication to a display at the perimeter of the display.

In accordance with the present invention, a system and method are provided which substantially reduce the disadvantages and problems associated with previous methods and systems for communicating with a display at the display perimeter. A touch detection grid having overlapping conductive traces that detect capacitive effects integrates into a protective cover having a rectangular shape with the capacitive traces placed parallel to diagonals of the rectangular shape. The capacitive traces exit the protective cover from opposing parallel sides of the rectangular shape to feed into one or more cables that interface with a touch controller.

More specifically, a portable information handling system processes information with a central processing unit (CPU) and memory disposed in portable housing that integrates a display to present the information as visual images. A transparent protective cover over the display, such as glass cover, integrates a touch detection grid, such as overlapping vertically spaced conductive traces etched in the glass to define intersections that detect capacitive effects. The conductive traces are disposed in the protective cover parallel to each of opposing diagonals of a rectangular shape of the protective glass so that interfaces with the conductive traces are located at opposing sides of the rectangular shape to communicate signals between the conductive traces and a touch controller. In one embodiment, the protective glass that holds the interfaces on the opposing sides of the rectangle shape fold over to the rear of the display so that touch detection is available to the perimeter of the display without interfaces located at the front of the display that consume front surface area of the display.

The present invention provides a number of important technical advantages. One example of an important technical advantage is that a portable information handling display touchscreen touch detection grid enters and leaves the protective glass from parallel sides, such as above and below the display when installed on an information handling system. The absence of touch detection lines from the sides of the display perimeter reduce and even eliminate protective housing coverage of the sides of the display, such as a bezel, so that 1.5 mm or less bezel size about the perimeter is possible. In one embodiment, the parallel sides of the display that support touch detection line communication may be folded over at manufacture to route the touch detection lines to the back of the display area, thus further reducing or even eliminating display bezel size. As a result, overall portable information handling system dimensions and footprint are reduced for a given integrated display size.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system detects touches at a display protective surface with a diagonally aligned touch detection grid. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
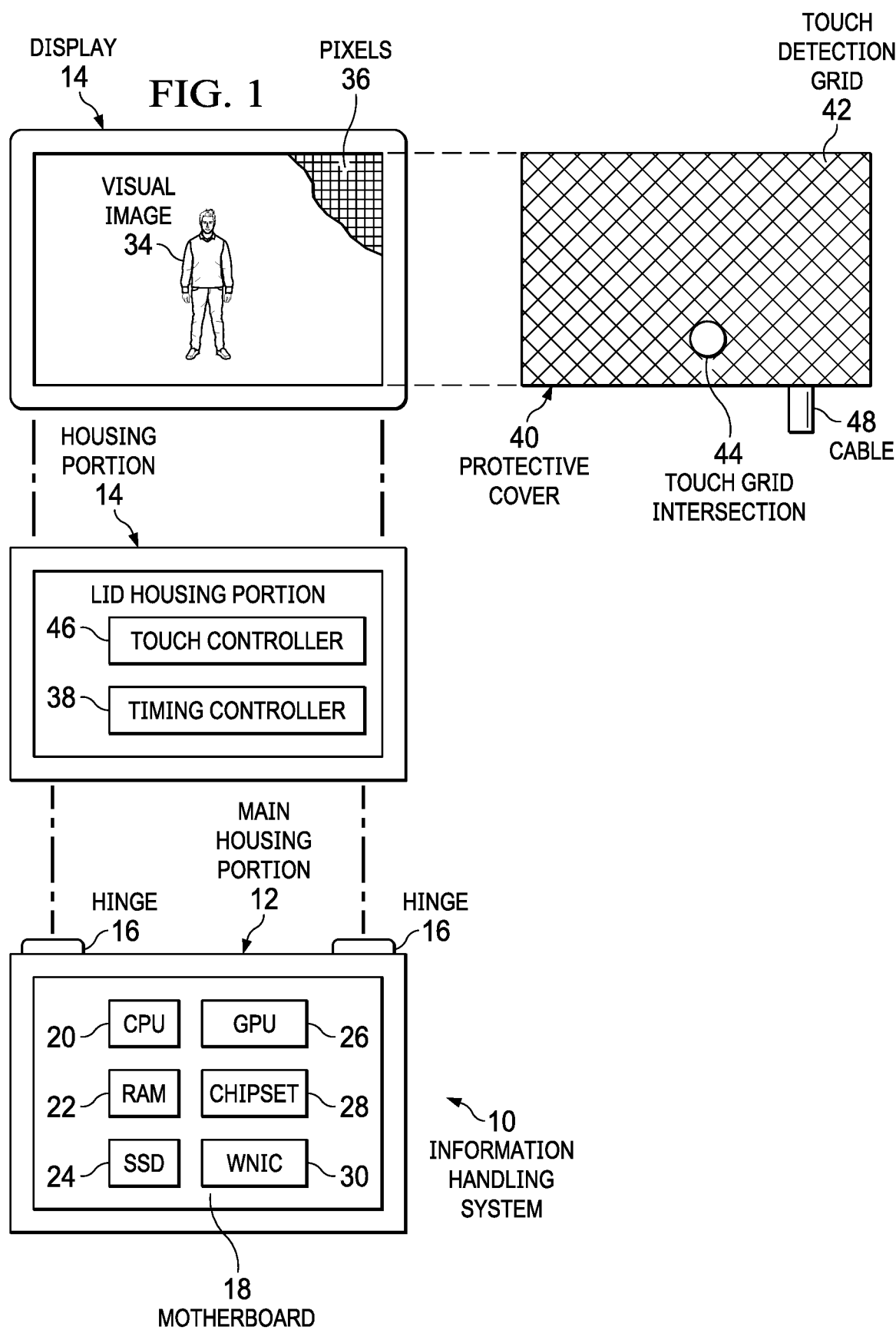
FIG. 1 depicts an exploded view of an information handling system having a touchscreen display with a diagonally aligned touch detection grid of conductive wires.

Referring now to FIG. 1, an exploded view depicts an information handling system 10 having a touchscreen display 32 with a diagonally aligned touch detection grid 42 of conductive wires. In the example embodiment, portable information handling system 10 has housing with a main housing portion 12 rotationally coupled to a lid housing portion 14 by hinges 16 that support rotation of housing portions 12 and 14 relative to each other in a clamshell or convertible configuration. An alternative embodiment may include tablet or all-in-one configurations having processing components disposed in a single planar housing. In one alternative embodiments, the touch detection grid may integrate in a peripheral display that presents images by a separate host information handling system, such as though a wired or wireless interface.

In the example embodiment, main housing portion 12 contains processing components that cooperate to process information for presentation as visual images. For example, a motherboard 18 couples to main housing portion 12 to support communication between a central processing unit (CPU) 20 and other processing components. For instance, random access memory (RAM) 22 stores instructions executed by CPU 20, such as operating system and application instructions retrieved from persistent memory or a solid state drive (SSD) 24. CPU 20 executes the instructions to generate visual information that a graphics processor unit (GPU) 26 processes into pixel values defining a visual image for presentation at display 32. A chipset 28 includes a variety processing components and firmware instruction stored in flash memory to manage operations at information handling system 10, such as application power, charging of an internal battery and communications with input/output (I/O) devices that an end user interacts with to interface with CPU 20. For example, chipset 28 includes a keyboard controller that reports keyboard, mouse and other touch inputs to CPU 20, such as touch inputs to a touchpad or to the touchscreen display 32 as described in greater detail below. A wireless network interface card (WNIC) 30 supports wireless interfaces, such as WiFi and Bluetooth communications with external networks and peripherals.

In the example embodiment, GPU 26 sends pixel values to a timing controller 38 of display 32 to present a visual image 34 with pixels 36 of display 32. For example, pixels 36 create illumination with OLED material based upon pixel values sent from GPU 26 to timing controller 38 and scanned in order across pixels 36. Alternatively, pixels 36 set a liquid crystal state based upon the pixel values so that light passing through pixels 36 has a color defined by the pixel values sent from GPU 26 and scanned by timing controller 38. A protective cover 40 is placed over display 32 to provide touchscreen functionality with touches detected by a touch detection grid 42 that defines capacitors at intersections 44 scan for capacitive effects by a touch controller 46. In various embodiments, various types of capacitive touch detection may be used with touch detection grid 42, including surface capacitance and projected capacitance that creates a three dimensional electrostatic field within protective cover 40. Protective cover 40 has touch detection grid 42 integrated within it using etching or other manufacture techniques.

As described below in greater detail below, touch detection grid 42 has a diagonal orientation relative to the rectangular shape of protective cover 42 that reduces trace routing around the perimeter of protective cover 40 to communicate touch detection grid 42 with a cable 48 that interfaces with touch controller 46. Conventional touch grids align with the vertical and horizontal sides of a rectangular shaped protective cover and route conductive traces from both a vertical and horizontal side of protective cover 40. Such conventional touch grids appear as a series of squares with each intersection of overlapping vertical and horizontal lines providing a touch detection point based upon capacitive effects associated with a touch at a touch grid intersection. In contrast, touch detection grid 42 aligns conductive traces with the diagonals of the rectangular shape of protective cover 40 to form an appearance of a series of diamonds. The diagonal orientation of conductive traces allows all traces to exit protective cover 40 form parallel sides of the rectangular shape instead of from perpendicular sides. The routing of interfaces through parallel opposing sides of the rectangle shape provides more flexibility in the interface to cable 48 so that a smaller perimeter footprint is available to cover display 32.

Figure 2:
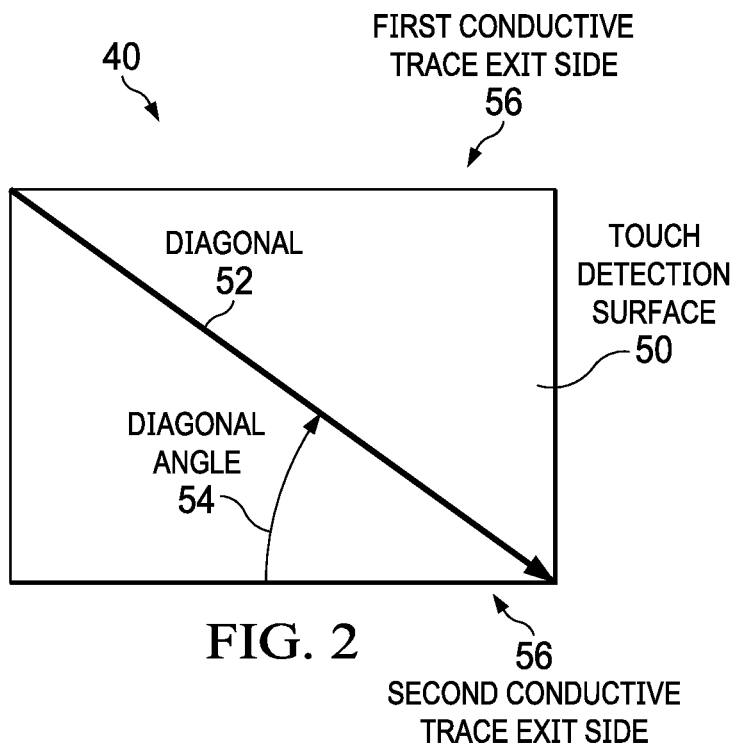
FIG. 2 depicts a touch detection protective cover having a first diagonal conductive wire alignment.

Referring now to FIG. 2, a touch detection protective cover 40 is depicted having a first diagonal 52 conductive wire alignment. In the example embodiment, the diagonal angle 54 is determined by dissecting the rectangular shape of protective cover 40 from an upper left to a lower right corner. A first conductive trace exit side 56 at the upper side of cover 40 provides routing of signals from a wire on diagonal 52 out of cover 40 while the opposing side of diagonal 52 terminates without an external connection. First conductive trace exit side 56 provides an external interface for wire traces that terminate along that side. A second conductive trace exit side 58 at the bottom of cover 40 provides an external interface for wire traces that terminate along that side. The use of diagonal conductive traces as described further below supports interfaces with conductive traces exiting cover 40 from parallel sides of the rectangular shape. In various embodiments, the traces may proceed through cover 40 at diagonal angles that vary from the corner to corner angle depicted. For instance, angles off of an exact dissecting diagonal angle would have varied interfaces along sides 56 and 58 that may provide advantages in various situations.

Figure 3:
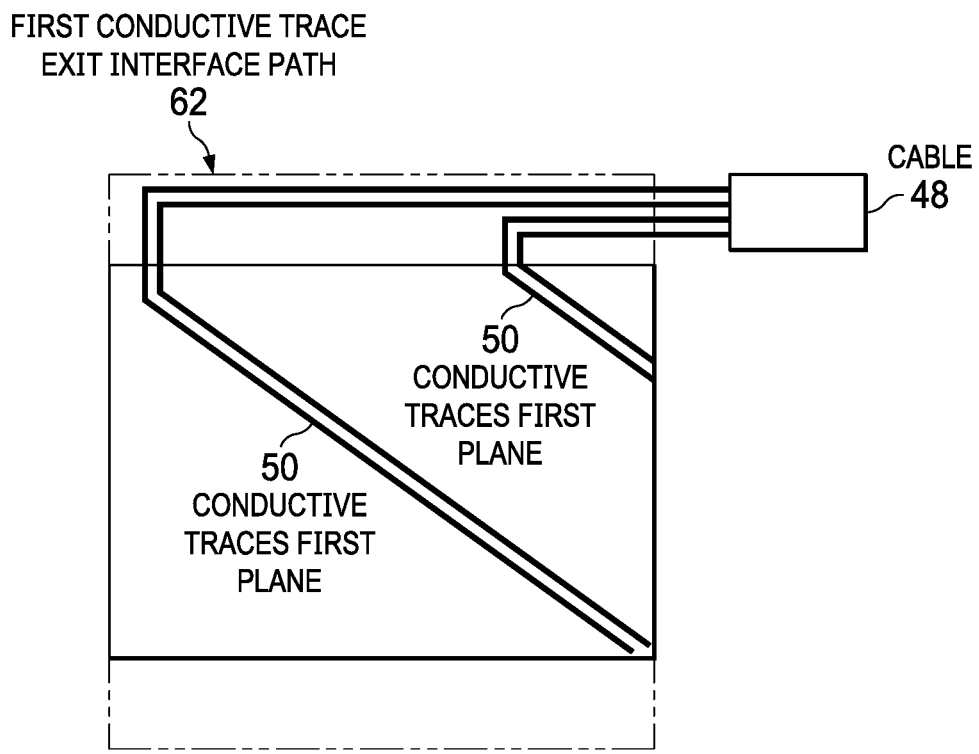
FIG. 3 depicts the touch detection protective cover having plural conductive wires aligned with the first diagonal and exiting the protective cover through a first conductive trace interface path.

Referring now to FIG. 3, the touch detection protective cover 40 is depicted having plural conductive wires 60 aligned with the first diagonal 52 and exiting the protective cover 40 through a first conductive trace interface path 62. Spacing between conductive traces 60 is set to achieve a desired touch precision with conductive traces 60 laid in a parallel pattern upwards from the diagonal 52 to the upper right corner of cover 40. At first conductive trace exit 56, the first conductive trace interface path 62 redirects traces proceeding out of cover 40 towards an interface with cable 62. Within first conductive trace interface path 62, each trace stacks vertically to communicate with cable 48 at the edge of protective cover 40. In alternative embodiments, traces 60 may feed directly out of the upper side of cover 40 or route to a location other than the example cable 48 location depicted in FIG. 3. As set forth below, bending the glass of protective cover 40 places the traces 60 at the rear of cover 40 to provide greater flexibility for the routing of traces 60 through one or more cables to touch controller 46.

Figure 4:
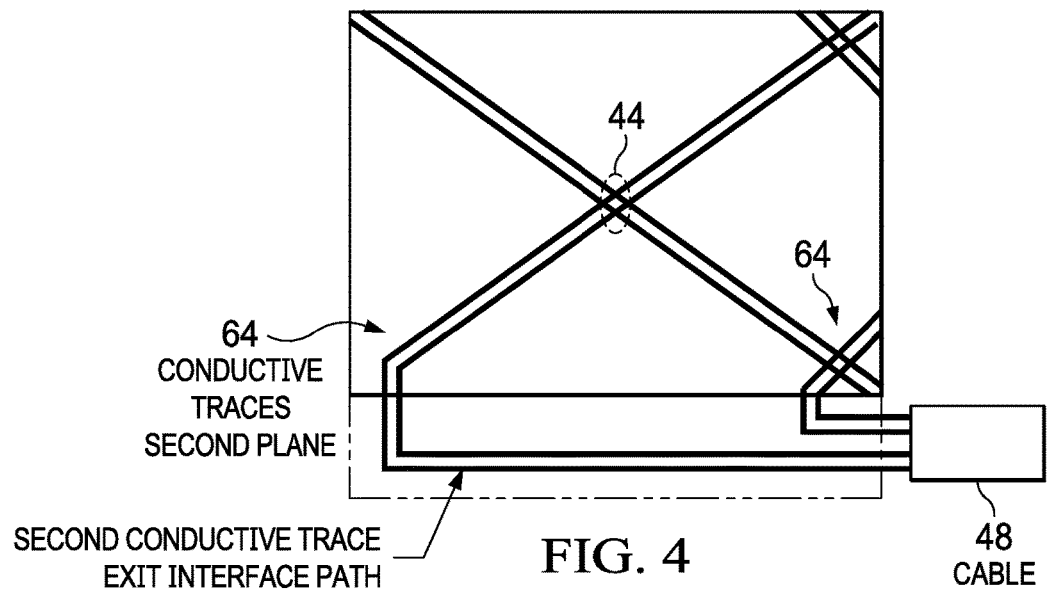
FIG. 4 depicts the touch detection protective cover having plural conductive wires aligned with a second diagonal and exiting the protective cover through a second conductive trace interface path.

Referring now to FIG. 4, the touch detection protective cover 40 is depicted having plural conductive wires 64 aligned with a second diagonal and exiting the protective cover 40 through a second conductive trace interface path 65. Conductive traces 64 align parallel to an opposite diagonal of traces 60 to cross over traces 60 at intersections 44 at which capacitive effects are scanned. In the example embodiment, cover 40 has folded over at the upper side to rotate first conductive trace interface path 62 at the rear of cover 40. On the rear side of cover 40, traces of interface path 62 interface with cable 48, which then proceeds to second conductive trace interface path 65. In order to complete the diagonal layout of traces 60 and 64, parallel traces are integrated in cover 40 at the desired spacing with traces terminating at the vertical sides of cover 40 without an interface and routing out at the horizontal sides of cover 40. In one embodiment, all traces route out of the parallel upper and lower sides so that no interface is needed along the vertical sides of cover 40. Thus, second conductive trace interface path 65 is also folded behind cover 40 to provide complete routing of traces at the rear of cover 40 from just the upper and lower sides. Folding of glass used to build cover 40, such as Gorilla glass, along parallel sides provide more convenient manufacture and reduced size that supports smaller bezels dimensions around the outer perimeter of cover 40.

Figure 5:
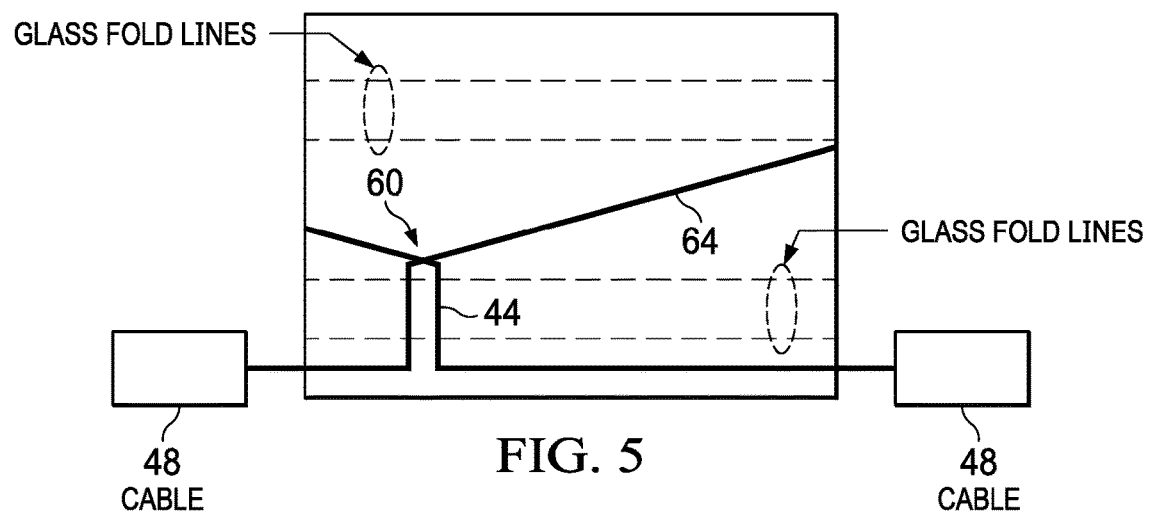
FIG. 5 depicts the touch detection protective cover having plural overlapping conductive wires that run parallel with opposite diagonals and exit from a common side of the protective cover.

Referring now to FIG. 5, the touch detection protective cover 40 is depicted having plural overlapping conductive wires 60 and 64 that run parallel with opposite diagonals and exit from a common side of the protective cover 40. In the example embodiment, interface for wires 64 feed out to the left side of cover 40 and interfaces for wires 60 feed out to the right side of cover 40. In one example embodiment, all traces 64 feed to the right side, including traces that exit from the upper side, and all traces 60 feed to the left side, including traces that exit from the upper side. Have all traces 60 and all traces 64 feed to the same side provides a cable 48 interface for each set of diagonal wires at one side of cover 40. In the example embodiment, a double fold of cover 40 is performed to isolate the interface wires on the rear side of cover 40. In one embodiment, each fold has a set of interface wires from the same diagonal so that each fold provides a separation between the interface traces behind cover 40. In various embodiments, various interface paths may be used to provide ease of manufacture for interfacing with cable 48 and supporting touch detection. In example embodiment, data traces that run pixel information to pixels of a display may run parallel to one or both diagonals.

Figure 6:
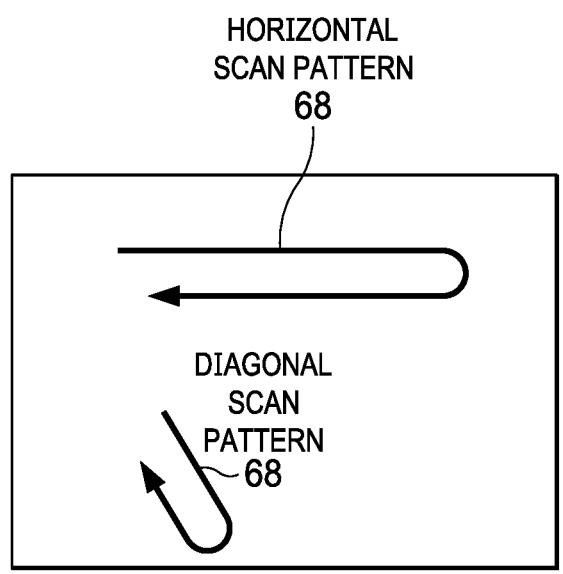
FIG. 6 depicts horizontal and diagonal touch detection scan patterns of a touchscreen display having diagonally aligned conductive traces.

Referring now to FIG. 6, horizontal and diagonal touch detection scan patterns 66 and 68 are depicted of a touchscreen display having diagonally aligned conductive traces. Horizontal scan pattern 66 follows a horizontal path across the width of display 32 and increments in a vertical direction after each horizontal scan is complete. For example, touch controller 46 steps increments an interval across both opposing diagonal traces in the scan so that that scan remains horizontal by skipping across the diamond pattern of the diagonally aligned touch grid 42. Alternatively, in diagonal scan pattern 68, touch controller 46 scans along a diagonal trace to its end and then increments up or down by an interval to another trace of the same interval. In various embodiments, various other scan patterns may be selected that provide desired touch detection. For instance, scans may alternate between opposing diagonal traces or follow other patterns that most efficiently detect touch.

Although the present invention has been described in detail, it should be understood that various changes, substitutions and alterations can be made hereto without departing from the spirit and scope of the invention as defined by the appended claims.

What is claimed is:
1. A portable information handling system comprising:
a housing having a rectangular shape with four sides;
a processor operable to process information;

a memory interfaced with the processor and operable to store the information;

a graphics processor interfaced with the processor and memory and operable to generate pixel values from the information that define a visual image;

a display interfaced with the graphics processor and integrated in the housing, the display operable to apply the pixel values to present the visual image;

a transparent cover disposed over the display;

a touch controller interfaced with the processor and operable to determine touches by capacitive effects associated with the touches at conductive traces interfaced with the touch controller; and a touch detection grid having plural conductive traces integrated in the transparent cover, the touch detection grid conductive traces entering the transparent cover from parallel first and second of the four sides;

wherein the transparent cover folds along the first and second parallel sides so that a first and second conductive trace interface path are located at the rear side of the transparent cover at a side opposite the touch detection grid.

2. The portable information handling system of claim 1 further comprising:

a cable communicating between the touch controller and the touch detection grid;

the first conductive trace interface path extending along the first parallel side and integrated in the transparent cover to communicate with at least some of the touch detection conductive grid and the cable; and the second conductive trace interface path extending along the second parallel side and integrated in the transparent cover to communicate with at least some of the touch detection conductive grid and the cable.

3. The portable information handling system of claim 1 wherein the housing comprises a single planar housing containing the processor, memory, graphics processor and touch controller under the display.

4. The portable information handling system of claim 1 wherein the housing comprises first and Second portions rotationally coupled to each other, the first portion integrating the display, the second portion integrating the processor, memory and graphics processor.

5. The portable information handling system of claim 1 wherein the touch detection grid plural conductive traces include first and second sets of conductive traces that overlap to define plural intersections, each intersection providing a capacitive touch detection point.

6. The system of claim 5 wherein the protective cover has a rectangle shape first and second diagonals, the first set of conductive traces running parallel to the first diagonal, the second set of conductive traces running parallel to the second diagonal.

7. The system of claim 6 wherein the touch controller scans the plural intersections parallel to parallel of the first and second sides.

8. The system of claim 6 wherein the touch controller scans the plural intersections parallel to the first diagonal.

9. A method for integrating touch detection a display, the method comprising:

integrating a touch detection grid into a protective surface having a rectangle shape, the touch detection grid having a first set of plural conductive traces running parallel to a first diagonal of the rectangle and a second set of plural conductive traces running parallel to a second diagonal of the rectangle, the first and second sets of plural traces having plural intersections;

routing the first and second sets of conductive traces from the protective surface only at opposing parallel sides of the protective surface rectangle;

interfacing the conductive traces with a touch controller through a cable only at the opposing parallel sides; and detecting touches based upon capacitive characteristics at the intersections.

10. The method of claim 9 further comprising folding the parallel sides to dispose the routing of the first and second sets of conductive traces from the protective surface at a rear side of the protective surface.

11. The method of claim 10 further comprising:

coupling an OLED display film to the rear side of the protective surface; and integrating the OLED display into a portable information handling system housing.

12. The method of claim 11 further comprising running control lines to OLED pixels in parallel with the first diagonal.

13. The method of claim 9 wherein the detecting touches further comprises scanning the plural intersections in a horizontal pattern.

14. The method of claim 9 wherein the detecting touches further comprises scanning the plural intersections in a diagonal pattern.

15. A display comprising:

plural pixels disposed to illuminate a visual image;

a protective coyer disposed over the display, the protective cover having a rectangular shape;

a touch detection grid integrated in the protective cover, the touch detection grid having a first set of conductive wires running parallel to a first diagonal of the rectangular shape and a second set of conductive wires running parallel to a second diagonal of the rectangular shape, the first and second set of conductive wires forming intersections; and a touch controller interfaced with the first and second set of conductive wires and operable to scan capacitance at the intersections to detect touches at the protective surface;

wherein the conductive wires exit the protective surface to interface with the touch controller through only first and second parallel sides of the rectangular shape, the first set of conductive wires through the first parallel side, the second set of conductive wires through the second parallel side.

16. The display of claim 15 further comprising:

a first conductive trace interface path formed in a first side of the protective cover to interface with conductive wires of the touch detection grid;

a second conductive trace interface path formed in a second side of the protective to interface with conductive wires of the touch grid, the first and second sides on opposing parallel sides of the rectangular shape; and one or more cables that interface the first and second conductive trace interface paths with the touch controller.

17. The display of claim 15 wherein control lines interfaced with the plural pixels run parallel to one or both of the first and second diagonals.

* * * * *

UNITED STATES PATENT AND TRADEMARK OFFICE
CERTIFICATE OF CORRECTION

PATENT NO.        : 10,671,227 B2
APPLICATION NO.   : 16/101724
DATED             : June 2, 2020
INVENTOR(S)       : Stefan Peana and Laurent Andrew Regimbal Page 1 of 1

It is certified that error appears in the above-identified patent and that said Letters Patent is hereby corrected as shown below:

In the Claims

In Line 59, Column 7, in Claim 9, please insert --in-- after "detection".

Signed and Sealed this
Twenty-second Day of September, 2020

Andrei Iancu
*Director of the United States Patent and Trademark Office*